(12) United States Patent
Stengel

(10) Patent No.: US 7,409,416 B2
(45) Date of Patent: Aug. 5, 2008

(54) DIGITAL-TO-TIME CONVERTER USING CYCLE SELECTION WINDOWING

(75) Inventor: Robert E. Stengel, Pompano Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 291 days.

(21) Appl. No.: 11/420,941

(22) Filed: May 30, 2006

(65) Prior Publication Data

US 2007/0283316 A1 Dec. 6, 2007

(51) Int. Cl.
*G06F 1/02* (2006.01)
(52) U.S. Cl. ...................................... 708/270
(58) Field of Classification Search .......... 708/270–277
See application file for complete search history.

(56) References Cited

U.S. PATENT DOCUMENTS

| | | | |
|---|---|---|---|
| 6,104,223 A * | 8/2000 | Chapman et al. ............ 327/276 |
| 6,271,682 B1 * | 8/2001 | Lindsay ...................... 708/272 |
| 6,510,191 B2 | 1/2003 | Bockelman | |
| 7,072,920 B2 * | 7/2006 | Grushin ...................... 708/103 |
| 7,302,461 B2 * | 11/2007 | Mukherjee et al. .......... 708/819 |
| 2004/0210611 A1 * | 10/2004 | Gradishar et al. ........... 708/271 |
| 2004/0257130 A1 * | 12/2004 | Cafaro et al. ................ 327/141 |
| 2005/0091295 A1 * | 4/2005 | Harron et al. ............... 708/271 |
| 2008/0055008 A1 * | 3/2008 | Staszewski et al. .......... 331/37 |

* cited by examiner

*Primary Examiner*—Chat C Do

(57) ABSTRACT

A signal generator consistent with certain embodiments of the invention has a reference clock (34) producing a periodic sequence of reference clock output pulses. A window generator (38) generates a plurality of time windows through which a selected plurality of the reference clock output pulses are selectively passed as windowed pulses so that the windowed pulses form a selected pattern of pulses. A programmable delay (46) has resolution of delay that has finer time granularity in delay than the period of the clock output pulses. The programmable delay (46) delays each of the windowed pulses by a programmed delay time to thereby provide a timing correction to the windowed pulses to produce an output pattern of pulses.

37 Claims, 9 Drawing Sheets

DIGITAL-TO-TIME CONVERTER USING CYCLE SELECTION WINDOWING

FIELD

This invention, in accordance with certain embodiments, relates generally to the field of direct digital signal synthesis. More particularly, certain embodiments consistent with this invention relate to reduction and possible elimination of calibration in direct digital signal synthesis using digital-to-time conversion.

BACKGROUND

U.S. Pat. No. 6,510,191 "Direct Digital Synthesizer Based on Delay Line with Sorted Taps," to Bockelman, and assigned to Motorola, the assignee of the present application, relates to a method of providing a time resolution increase in a clock generation circuit by use of a delay line having a number of delay taps. In this circuit, the series connected delay line elements form a part of the path of the output signal being synthesized. As a result, all of the delay line imperfections such as accumulated mismatch, delay lock loop offset error, and summed thermal noise can impact the output signal quality. Some or all of this error can be removed using calibration techniques in certain circumstances.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
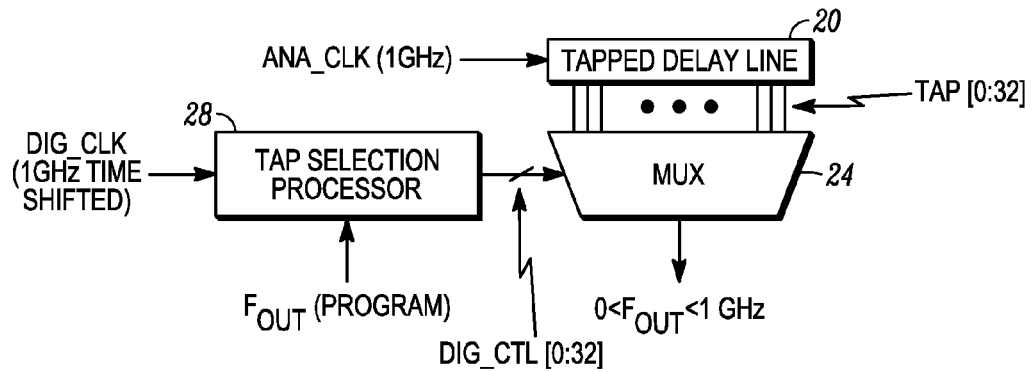
FIG. 1 is a block diagram of a digital to time converter.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

The terms "much greater", "much smaller", "much higher", "much finer", etc. are used in the accepted engineering sense. That is, if A is much greater than B, then A is larger than B by at least a factor of five to ten times.

Calibration of a delay line circuit in a direct digital conversion signal generator can be reduced or eliminated in accordance with certain embodiments consistent with the present invention, in which a sorted or mapped tap selection calibration is used to overcome the in line digital-to-time converter imperfections.

By way of example, a 32 GHz reference clock is assumed for the present application, but the invention is in no way limited to that specific example used for illustrative purposes only. However, this embodiment pushes the current technical limits and in so doing, provides a digital clock, or other signal, generator with high accuracy and little if any need for calibration. In this embodiment, a digital-to-time converter such as that disclosed in U.S. Pat. No. 6,510,191 is modified so as to provide a cycle selection windowing function for a high frequency reference signal, rather than as a mechanism for production of the desired output signal directly. As a result, the digital-to-time converter no longer forms a part of the synthesized output signal path. By removing the digital-to-time converter from the synthesized output signal path its impact on the output signal quality is eliminated.

The use of the windowing function provides a much more tolerant mechanism for digital-to-time conversion that minimizes or eliminates imperfections including thermal noise, significantly reducing the need for calibration of the digital-to-time converter. This facilitates use of embodiments consistent with the present invention for clock generation for a wide variety of products including, but not limited to, wireless communications products such as multiple band wireless telephones and the like. Moreover, with minor modification, embodiments consistent with the present invention can be used to provide direct modulation functions including amplitude, frequency and phase modulations.

Turning now to FIG. 1, a simplified illustration of the digital to time converter (DTC) of the above patent is depicted. The output signal of the DTC system shown in FIG. 1 starts at the ana_clk 1 GHz signal (the legend ana_clk means analog clock). This signal is processed along a tapped delay line 20 (which may form a part of a delay locked loop) and is routed through a multiplexer 24 selection path. The multiplexer 24 operates under control of digital block 28, which selects pulse transitions from the delay line that are passed to the output. By appropriate selection of transitions, by control signal dig_ctl (meaning digital control) a rising and falling edge can be provided for each cycle of a clock output $F_{OUT}$ to synthesize any desired frequency, in this example, between 0 and 1 GHz. The output signal quality is a function of the tapped delay line 20 and multiplexer 24 circuit implementation.

In accordance with certain embodiments consistent with the present invention, the circuit of FIG. 1 is suitably modified to provide a windowing function, rather than a direct output. That windowing function is used to pass selected pulses from a high frequency clock, and the position in time of those selected pulses can be further adjusted by using a programmable delay circuit. In one such embodiment, a reference clock produces a periodic sequence of reference clock output pulses, e.g., at 32 GHz. A window generator generates a plurality of time windows through which a selected plurality of the reference clock output pulses are selectively passed as windowed pulses so that the windowed pulses form a selected pattern of pulses that can define any desired signal pattern over a specified frequency range. A programmable delay, is provided that has resolution of delay that has finer time granularity in delay than the period of the clock output pulses. Preferably, the granularity is much finer than the period of the clock. The programmable delay delays each of the windowed pulses by a programmed delay time to thereby provide a timing correction to the windowed pulses to produce an output pattern of pulses.

Figure 2:
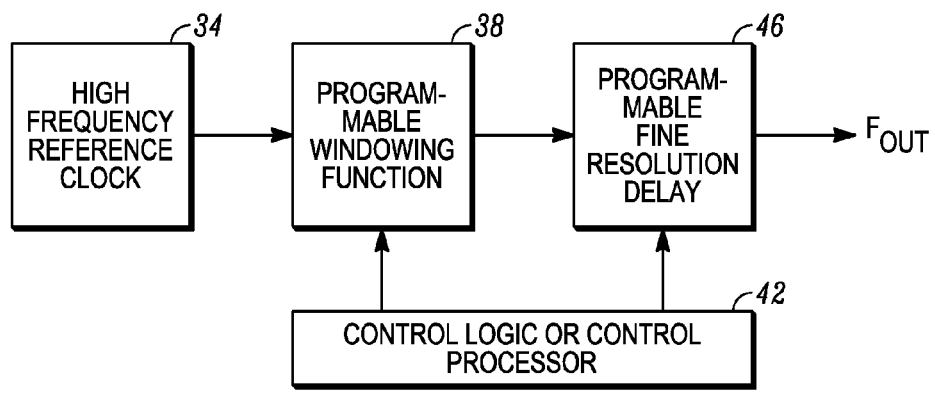
FIG. 2 is a block diagram of a digital to time converter (DTC) signal generator consistent with certain embodiments of the present invention.

Referring now to FIG. 2, a high-level block diagram of a digital-to-time converter consistent with certain embodiments of the present invention is depicted. In this embodiment, a high frequency reference clock 34 is used as a source of pulses that are selected to generate a desired output frequency. The output of the high frequency reference clock is passed through a programmable windowing function circuit 38. This programmable windowing function 38 is carried out using circuitry somewhat similar to that of the above referenced patent, except that rather than using tap selection logic to directly produce an output, a different set of logic is utilized to carry out the windowing function. The windowing function carried out at 38, in this embodiment, is used to select a pattern of pulses from the high frequency reference clock that are used to approximate an output frequency ($F_{OUT}$) that is desired and selected under control of control logic or control processor 42.

The programmable windowing function 38 can operate at a substantially lower clock frequency than the high frequency reference clock 34. This is because the accuracy needed to carry out the programmable windowing function needs to only be high enough to assure capture a single desired edge (either rising edge or falling edge) from the high frequency reference clock 34. Once this edge is selected by windowing function 38, the exact position of the edge is further adjusted using a programming fine resolution delay 46 to produce the output signal $F_{OUT}$.

Therefore, the output signal of the new DTC system shown in FIG. 2 begins with the 32 GHz reference signal. Selected cycles of this 32 GHz reference signal are processed through the programmed fine delay line to the $F_{OUT}$ terminal. The path from the 32 GHz reference signal to the $F_{OUT}$ terminal is the same for every selected cycle processed to the fine delay line input. The prior DTC system is modified to provide the cycle selection windowing function and does not contribute directly to the output signal quality.

Figure 3:
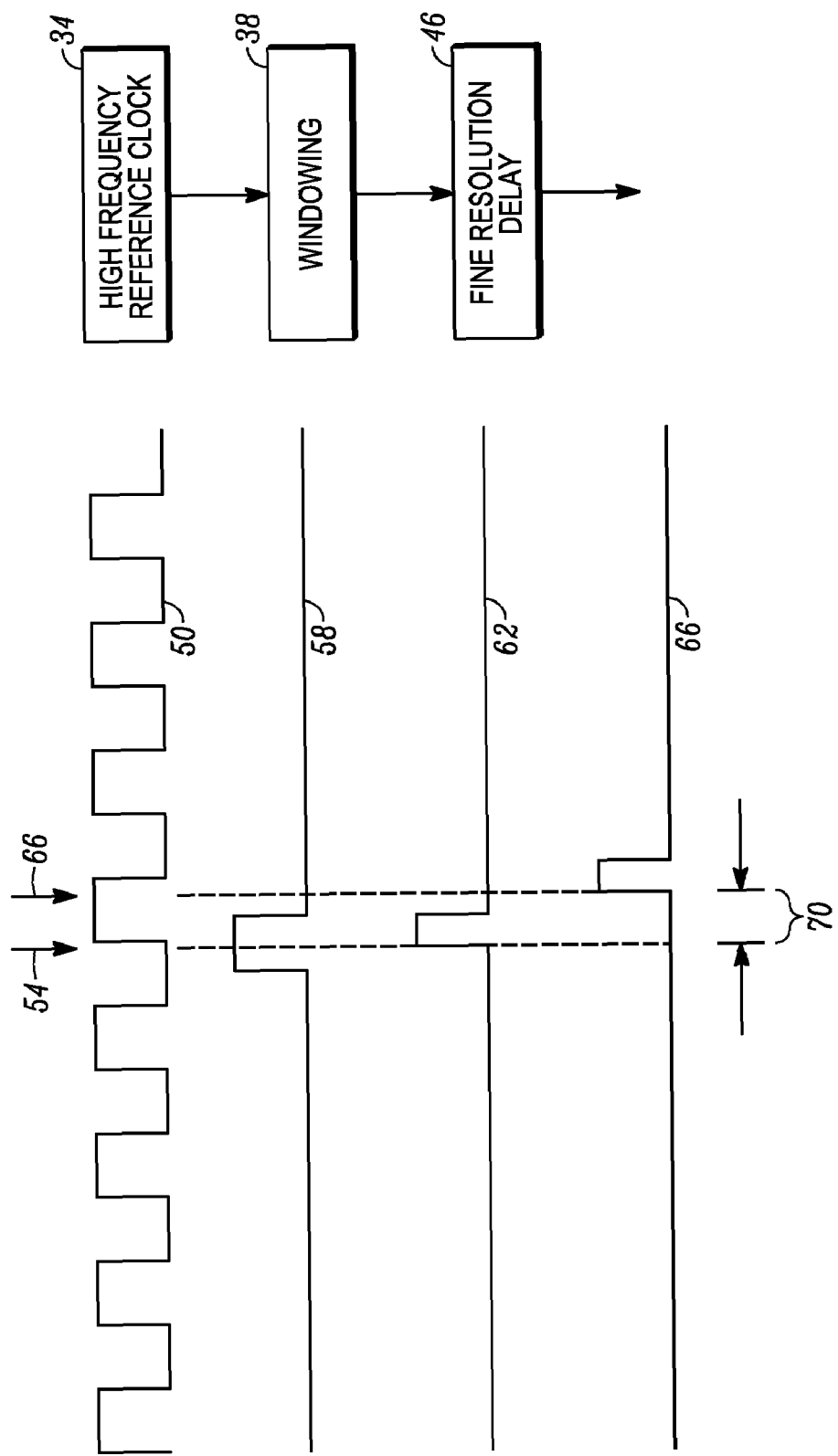
FIG. 3 is a diagram depicting the basic function of a DTC consistent with certain embodiments of the present invention.

This process may be more readily comprehended by reference to FIG. 3 which depicts the three main processing operations carried out, along with an exemplary set of waveforms illustrating the actions carried out by those functional blocks. High frequency reference clock 34 generates a high frequency sequence of pulses 50. For purposes of this illustrative example, assume that the rising edge indicated by arrow 54 is the edge that the control logic or control processor 42 programs the windowing function 38 to capture. Accordingly, windowing function 38 generates a window signal 58 that may be up to almost one period of clock signal 50 in duration. The accuracy of the windowing, therefore, only has to be accurate enough to capture the rising edge of a single pulse from the high frequency clock 34. In other examples, a similar embodiment could be devised to capture only the falling edge. In this example, the output of windowing function 38 is a windowed clock represented by the pulse shown as 62. Thus, the rising edge 54 is captured using the windowing function.

Now suppose that the control logic or control processor 42 establishes that the location that the pulse should actually appear in the output signal representing $F_{OUT}$ at the time location indicated by arrow 66. In order to achieve this, the delay shown as 70 is programmed into fine resolution delay 46 so that the output signal depicted at 74 has a rising edge at the desired location 66. By way of example, if the fine delay is programmable in 1 ps increments, the programmable delay can improve the accuracy of the output pulse edge timing to within 1 ps accuracy. For a 32 GHz high frequency reference clock, this represents an improvement of a factor of about 32 over the placement of the edge by simply windowing the high frequency reference clock edge.

Figure 4:
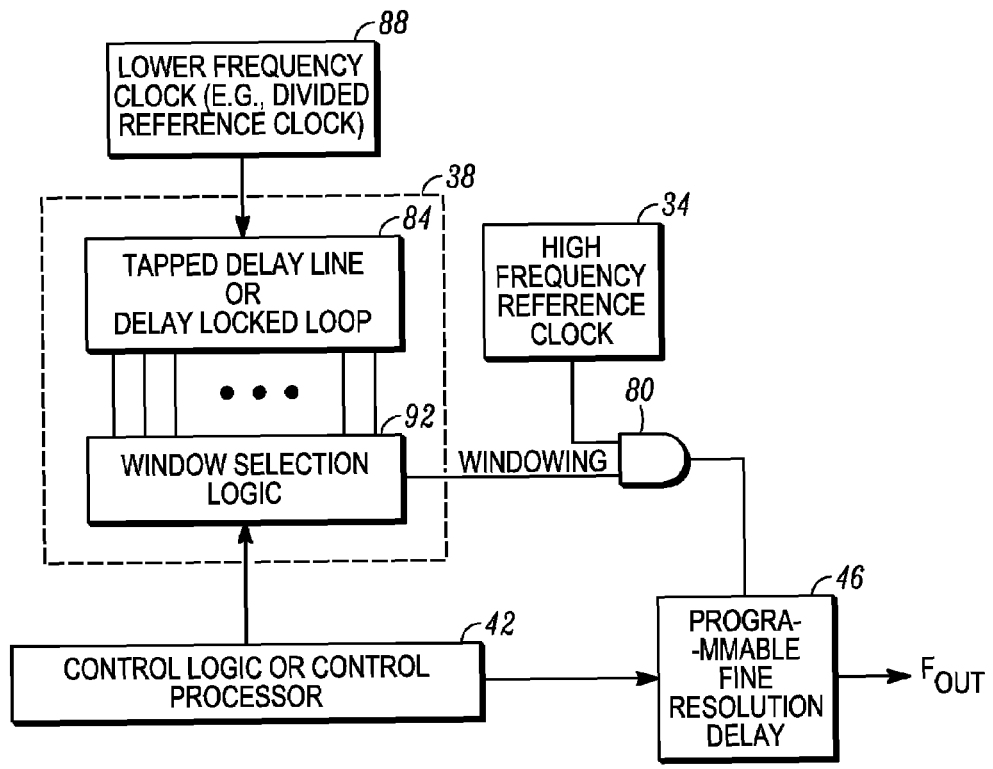
FIG. 4 is a more detailed diagram of an exemplary DTC consistent with certain embodiments of the present invention.

FIG. 4 depicts a more detailed embodiment of the digital-to-time converter of FIG. 2. In this embodiment, the high frequency clock 34 is applied to one input of an AND gate 80 with the windowing function from programmable window function 38 appearing at a second input of the AND gate 80. The programmable windowing function is implemented in this example as a programmable window function circuit 38 made up of a tapped delay line or delay locked loop 84. A lower frequency reference clock 88 supplies an input signal to the tapped delay line 84 or delay locked loop 84, and each of the tap outputs from the delay line is provided to a window selection logic circuit 92. The lower frequency clock 88 has frequency that is established so as to provide a window size less than a single period of the high frequency reference clock 34.

Window selection logic 92 operates under control of control logic or control processor 42 to determine which arrangement of delay line outputs at the delay line taps should be provided to an output as the windowing function (a window pulse) used by AND gate 80 to select an appropriate transition from high frequency reference clock 34. Windowing is actually carried out by the AND function at 80 (which could also be implemented with other logic gate arrangements such as NAND gates, etc.).

Thus, a signal generator in accordance with certain embodiments consistent with the present invention has a reference clock producing a periodic sequence of reference clock output pulses. A window generator generates a plurality of time windows through which a selected plurality of the reference clock output pulses are selectively passed as windowed pulses so that the windowed pulses form a selected pattern of pulses. A programmable delay, having resolution of delay that has finer time granularity in delay than the period of the clock output pulses, delays each of the windowed pulses by a programmed delay time to thereby provide a timing correction to the windowed pulses to produce an output pattern of pulses. In certain embodiments, the signal generator further has a controller that controls the location of the time windows and the delay times. The time windows and the delay times can be selected by the controller to produce an output pattern of pulses having a 50% duty cycle, a non-50% duty cycle or a modulated output pattern of pulses.

The signal generator, according to certain embodiments, has a delay line with a plurality of output taps. Window selection logic is responsive to the controller for logically selecting at least one of the output taps to represent the selected pattern of pulses. A logic gate receives the selected pattern of pulses and gates the reference output clock pulses using the selected pattern of pulses. The delay line is preferably clocked at a clock rate that is much lower than the reference clock rate, and can use a clock that is derived by dividing the reference clock. The programmable delay can, in certain embodiments, be programmed by varying at least one of a total resistance and a total capacitance in a resistor and capacitor based delay circuit. The programmable delay preferably has resolution of delay that has much finer time granularity in delay than the period of the clock output pulses, e.g., $\frac{1}{32}$ of the period of the clock output pulses.

In another embodiment, a signal generator has a reference clock producing a periodic sequence of reference clock output pulses. A window generator generates a plurality of time windows through which a selected plurality of the reference clock output pulses are selectively passed as windowed pulses so that the windowed pulses form a selected pattern of pulses. The window generator has a low frequency clock operating at a frequency lower than the reference clock, a delay line with a plurality of output taps, window selection logic for logically selecting at least one of the output taps to represent the selected pattern of pulses, and a logic gate receiving selected pattern of pulses and gating the reference output clock pulses using the selected pattern of pulses. A programmable delay is provided that has resolution of delay that has finer time granularity in delay than the period of the clock output pulses. The programmable delay delays each of the windowed pulses by a programmed delay time to thereby provide a timing correction to the windowed pulses to produce an output pattern of pulses. A controller controls the location of the time windows generated by the window selection logic and the delay times generated by the programmable delay.

Figure 5:
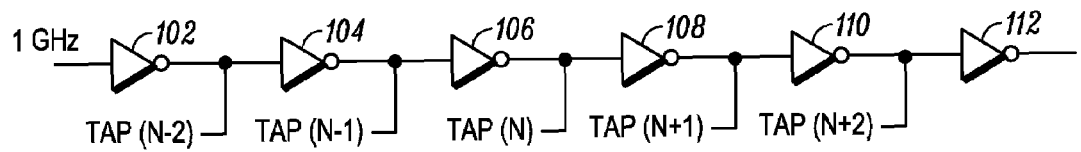
FIG. 5 is a tapped delay line consistent with certain embodiments of the present invention.
Figure 6:
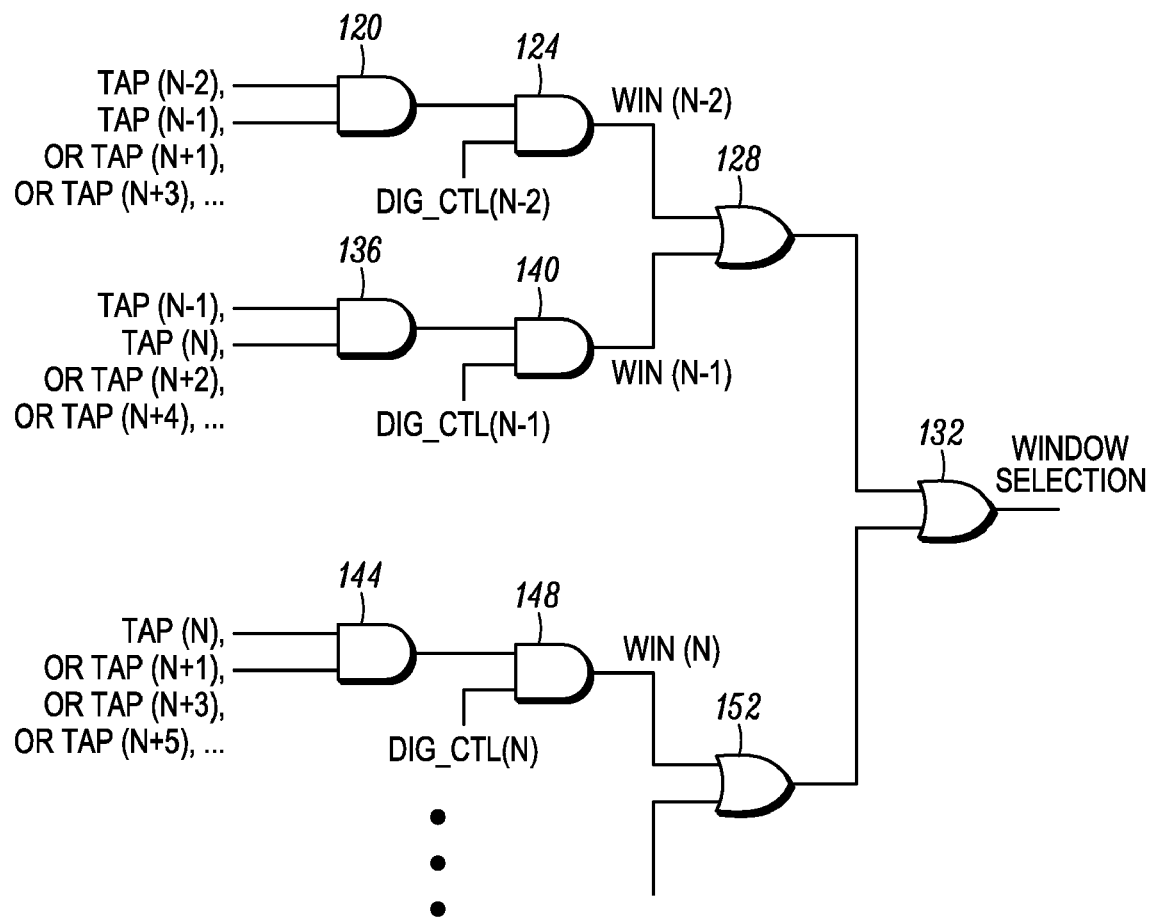
FIG. 6 is an illustrative window selection logic circuit consistent with certain embodiments of the present invention.

Many suitable logic arrangements can be devised to select an appropriate signal from one or more of the taps of delay line 84 to provide the windowing function for AND gate 80. One illustrative example is depicted in FIGS. 5 and 6. FIG. 5 depicts a tapped delay line that utilizes a series of invertors 102, 104, 106, 108, 110, and 112 as an illustrative example (other types of delay line configurations could also be used). The tap outputs for each of those invertors are respectively labeled tap(N−2) through tap(N+2) for reference. An illustrative embodiment of a portion of the window selection logic is depicted in FIG. 6, which can easily be extended to select an output from any of the delay line taps of delay line 84. In this embodiment, three branches are depicted which can be selectively enabled by digital control signals dig_ctl(N), dig_ctl(N−1), and dig_ctl(N−2) respectively to pass a windowing signal Win(N), Win(N−1), and Win(N−2).

The basic concept depicted here is that a pair of taps such as tap(N−2) and tap(N−1) can be compared using an AND gate 120. In this example, if the digital control signal dig_ctl(N−2) is enabled, then window win(N−2) is generated as an output of AND gate 124 and passed through OR gate 128 to the output OR gate 132. In a similar manner, tap(N−1) can be compared with tap(N), tap(N+2), tap(N+4), etc. at AND gate 136, and if AND gate 140 is enabled by digital control dig_ctl(N−1), the window defined by the time that the output of AND gate 136 is active is passed to the output of 132. A third path compares tap(N) with any of taps N+1, N+3, or N+5, etc. at AND gate 144. In the event that digital control dig_ctl(N) is enabled at 148, the window defined by AND gate 144 is passed through OR gate 152 to the output of OR gate 132. In this manner, each of the taps in delay line 84 can be compared with delay line taps that are separated by an odd number of taps to define a desired window. Other circuit embodiments can also be utilized to accomplish a similar purpose without departing from embodiments consistent with the present invention. The basic idea remains to devise a circuit that selects a particular tap or combination of taps to produce a suitable window to pass a single pulse edge, and any circuit to accomplish this function can be used.

The programmable fine resolution delay 46 should have a resolution that is finer than the period of the high frequency reference clock output signal. Preferably, the resolution of the programmable fine resolution delay 46 should be much greater than the period of the high frequency reference clock 34 (i.e., by a factor of at least five and preferably a factor of one hundred or greater). That is, the programmable fine resolution delay should be able to interpose very fine increments of delay on a rising or falling edge in comparison with the period of the high frequency reference clock. By way of example, if the high frequency reference clock 34 operates at 32 GHz, then the time between pulses is 31.25 picoseconds. If one wishes to have an ultimate output resolution of approximately one Pico-second, then the programmable fine resolution delay 46 could have 32 stages of delay, each of which are approximately $\frac{1}{32}$ of 31.25 Pico-seconds. If a lower frequency high frequency reference clock 34 is used or if lower resolution in the final output is acceptable (or both), the system can be designed accordingly to have a programmable fine resolution delay with suitably fine granularity.

Two taps with an odd inverter delay separation are applied to an AND function. This provides a pulse signal with the duration equal to the odd inverter delay separation value. This will become the open window duration defined in absolute time by the delay line tap. Only one of the dig_ctl lines is expected to be high during the 1 GHz digital processing period limiting the output frequency range to a maximum of 1 GHz. However, the system could be extended to a maximum of 32 GHz with careful design of the windowing duration and multiple dig_ctl signals during a 1 GHz digital processing period. Some care is needed in alignment of the 32 GHz signal with the 1 GHz digital processing production of the windowing signal.

In the 32 GHz high frequency reference clock 34 example given above, a one Pico-second delay that is programmable by control logic or control processor 42 may present a technical challenge. However, a number of techniques can be utilized to achieve such a fine resolution delay.

Figure 7:
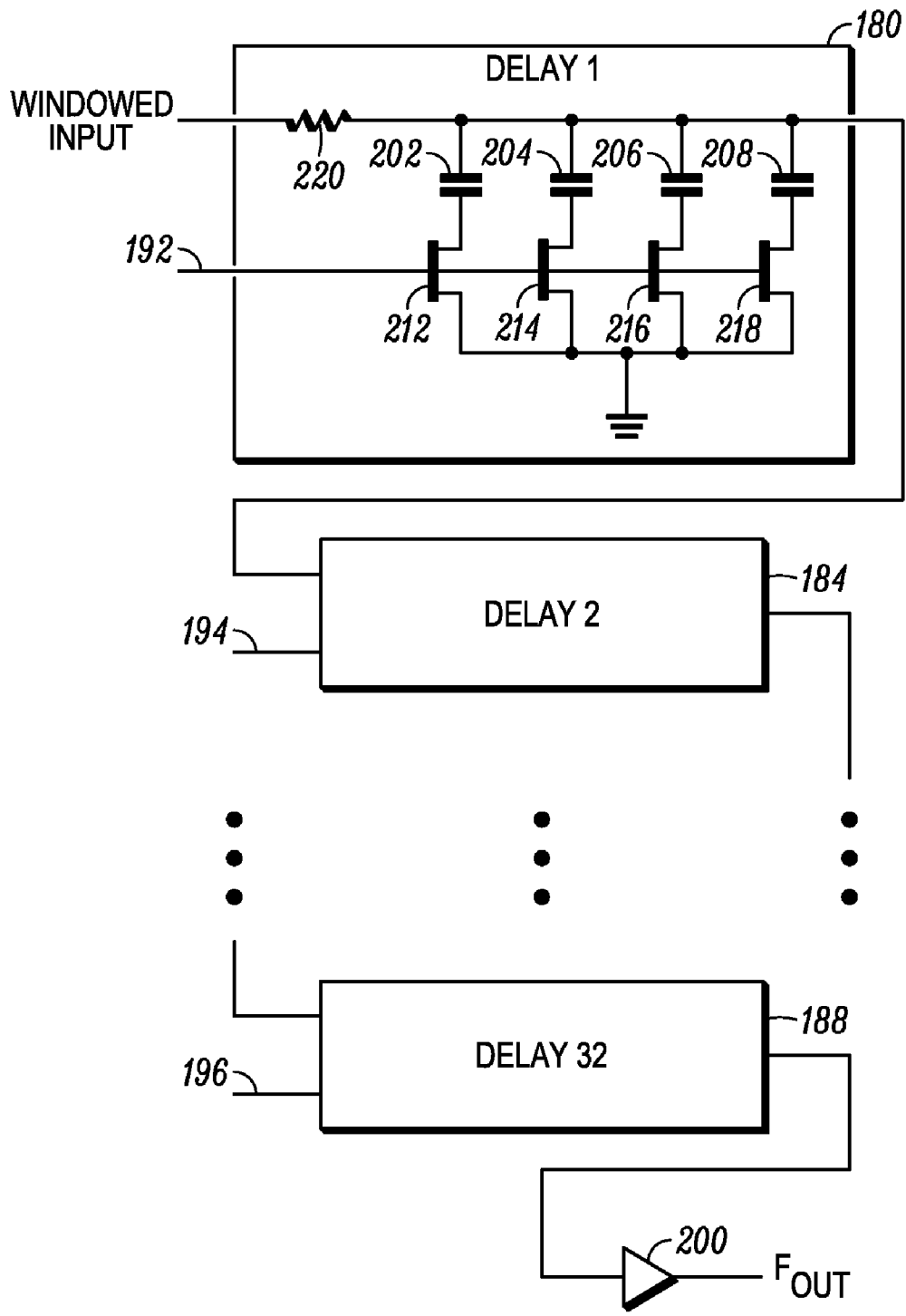
FIG. 7 is a diagram of one example of a programmable fine resolution delay circuit consistent with certain embodiments of the present invention.

FIG. 7 depicts one embodiment of a circuit that provides such a high resolution delay. In this circuit, the windowed input from the programmable windowing function circuit 38 is provided to the input of a bank of 32 delay elements 180, 184 through 188. These delay elements operate under control of control inputs 192, 194, through 196 to selectively enable a bank of four capacitors 202, 204, 206, and 208 each using a set of N-channel field effect transistors 212, 214, 216, and 218 to either ground the bottom of capacitors 202, 204, 206, and 208 or leave the capacitors floating. These capacitors, when enabled, operate in conjunction with resistor 220 to produce an R-C delay that passes through the bank of identically configured delays. As many of the 32 delay blocks can be enabled as desired to produce increments of one Pico-second. The output of the chain of delay blocks is applied to a logic circuit, such as buffer 200, so that an output transition will occur whenever the threshold voltage of logic circuit 200 is reached.

In accordance with the present embodiment wherein approximately one Pico-second of delay is desired from each of the delays 180 through 188, the four capacitors are designed as parallel plate capacitors (using integrated circuit technology) that are approximately $625 \times 10^{-18}$ Farads each. When four such capacitors are simultaneously enabled by turning on the N-channel field effect transistors, each bank represents approximately 2.5 Femto-Farads. These capacitors operate with approximately 0.5 ohm as resistor 220 (along with an additional series resistance that is added to the circuit) to produce approximately one Pico-second of delay until the voltage at the input of device 200 reaches the logic voltage threshold. Those skilled in the art will appreciate that symmetrical layout and other considerations should be utilized to design such devices and that some experimentation with plate design, resistor value, logic threshold, and layout may be required to achieve the desired degree of accuracy.

Figure 8:
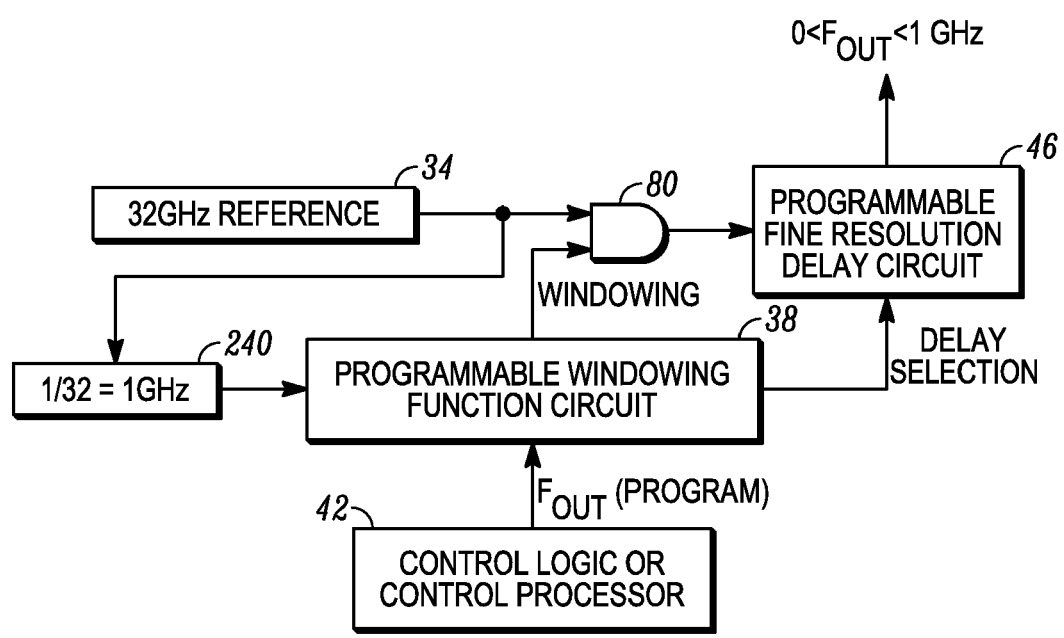
FIG. 8 is an illustrative example of a 32 GHz reference clock based DTC consistent with certain embodiments of the present invention.

In accordance with certain embodiments, an example of a 32 GHz clock based circuit is depicted in FIG. 8. In this example, the high frequency clock 34 is shown as a 32 GHz reference clock. In order to obtain a lower frequency clock for use by the programmable windowing circuit, the 32 GHz reference clock is divided by 32 at a digital divide by 32 divider 240, to produce a 1 GHz clock to the programmable windowing circuit 38. A programmable fine resolution delay 46 is provided using the design discussed in connection with FIG. 7 so that the output can be programmed to produce any output frequency between 0 and 1 GHz with edge transitions placed within 1 Pico-second accuracy using the technique described previously.

Thus, a signal generator consistent with certain embodiments has a 32 GHz reference clock producing a periodic sequence of reference clock output pulses. A divide-by-32 divider divides the reference clock to produce a 1 GHz low frequency clock. A window generator generates a plurality of time windows through which a selected plurality of the reference clock output pulses are selectively passed as windowed pulses so that the windowed pulses form a selected pattern of pulses. The window generator has a delay line receiving the 1 GHz clock and having a plurality of output taps, window selection logic for logically selecting at least one of the output taps to represent the selected pattern of pulses, a logic gate receiving selected pattern of pulses and gating the reference output clock pulses using the selected pattern of pulses. A programmable delay has resolution of delay that is approximately 1/32 of a period of the reference clock output pulses. The programmable delay delays each of the windowed pulses by a programmed delay time to thereby provide a timing correction to the windowed pulses to produce an output pattern of pulses. A controller controls the location of the time windows generated by the window selection logic and the delay times generated by the programmable delay.

In another embodiment, a signal generator consistent with certain embodiments has a reference clock producing a periodic sequence of reference clock output pulses having a rising edge and a falling edge. A rising edge window generator generates a plurality of time windows through which a selected plurality of the rising edges are selectively passed as windowed rising edges so that the windowed rising edges form a selected pattern of rising edges. A falling edge window generator generates a plurality of time windows through which a selected plurality of the falling edges are selectively passed as windowed falling edges so that the windowed falling edges form a selected pattern of falling edges. A rising edge programmable delay has resolution of delay that has finer time granularity in delay than the period of the clock output pulses, the rising edge programmable delay delaying each of the windowed rising edges by a programmed delay time to thereby provide a timing correction to the windowed rising edges to produce a pattern of rising edges. A falling edge programmable delay has resolution of delay that has finer time granularity in delay than the period of the clock output pulses, the falling edge programmable delay delaying each of the windowed falling edges by a programmed delay time to thereby provide a timing correction to the windowed falling edges to produce a pattern of falling edges. The rising and falling edges are combined in a suitable manner to produce an output signal.

Figure 9A:
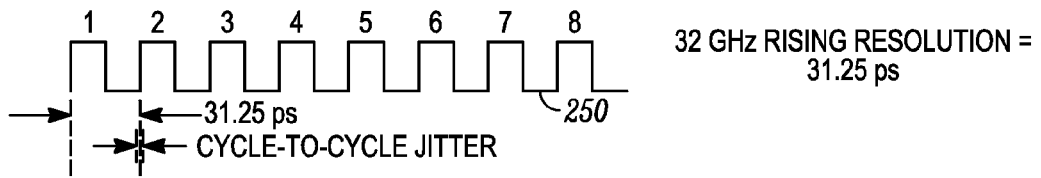
FIG. 9, which is made up of FIG. 9A, 9B and 9C, is a timing diagram illustrating alternative high frequency clock generation techniques consistent with certain embodiments of the present invention.
Figure 9B:
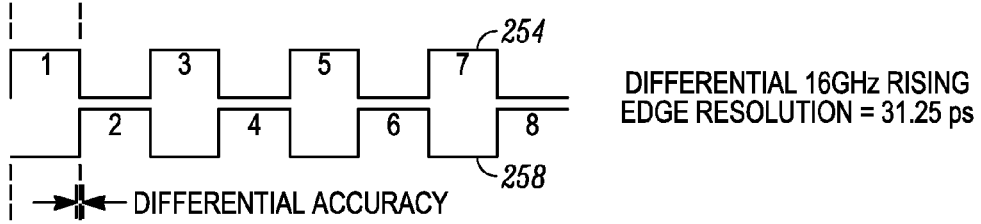
Figure 9C:
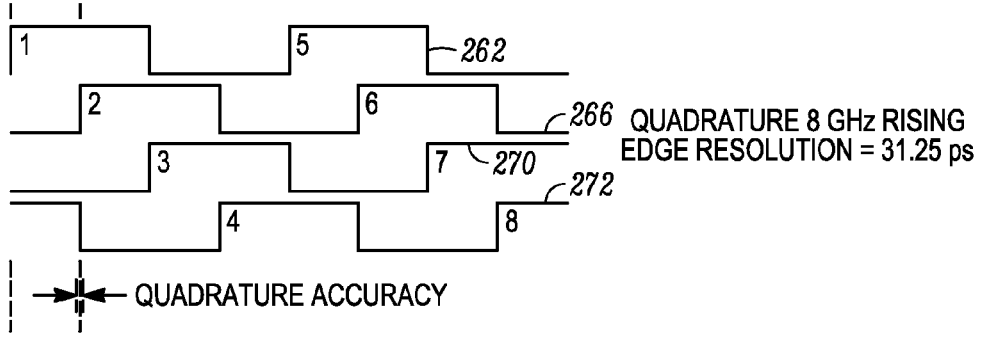

It is further noted that generation of a 32 GHz clock circuit, while readily implementable in present day technology to directly generate 32 GHz, is also a technical challenge. Several options present themselves for simplification of the design of the high frequency clock. FIG. 9, which is made up of FIGS. 9A, 9B, and 9C, depict three different mechanisms for generating a 32 GHz clock. Signal 250 represents an output signal generated from a 32 GHz oscillator (idealized), which may be generated using conventional oscillator techniques. However, FIG. 9B illustrates that by use of a differential 16 GHz clock circuit, each of the rising edges can be obtained from either signal 254 or signal 258. At these frequency levels, it is noted that generating a 16 GHz clock is substantially simpler than generating a 32 GHz clock. FIG. 9C further simplifies the task by use of quadrature 8 GHz clock generation. In this example, it is again noted that each of the rising edges of the 32 GHz clock can be obtained from one of the quadrature signals 262, 266, 270, or 272. This concept can be further extended to more phases if desired.

Figure 10:
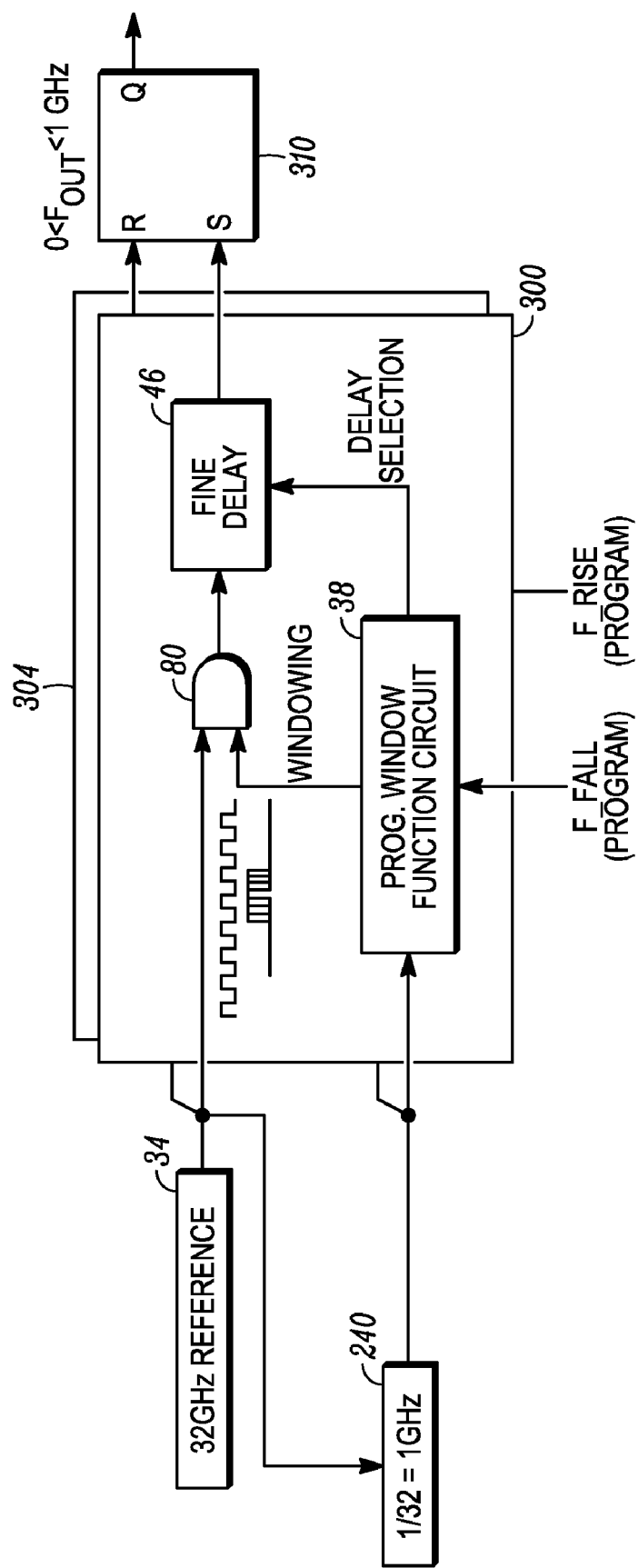
FIG. 10 is an illustrative example of a DTC that generates both rising and falling edge outputs consistent with certain embodiments of the present invention.

Up to this point, only the case of generating an appropriately located output signal rising edge has been addressed. However, the techniques and apparatus described herein can be also utilized to precisely locate a falling edge in addition to or instead of a rising edge. FIG. 10 depicts a circuit utilized to capture rising edge signals to generate a symmetrical 50% duty cycle output signal with both rising and falling edge pulses as outputs thereof In this embodiment, the high frequency clock reference (again illustrated as 32 GHz by way of example) 34 is provided to two nearly identical circuits 300 and 304. Circuit 304 operates in the manner previously described, except that it generates a windowing function under control of the control processor that identifies a rising edge of the input clock signal to define the falling edge time of the output signal. This falling edge is then applied to AND gate 80 to window an appropriate rising edge. This rising edge is then applied to programmable fine resolution delay 46 to produce a first output. A second output that captures the rising edge and operates in the manner previously described provides an output from 300. The two outputs are respectively applied to an RS flip-flop to obtain the output with rising and falling edges each defined in time by the digital to time converter process described.

An R-S flip flop is shown in this embodiment for combining rising edges, but in other embodiments, other mechanisms can be used to combine the edges including, simple addition, multiplexing, differential amplification. The processing described has used rising edges of the high frequency 32 GHz reference clock 34 of FIG. 10. Any combination of rising edges, falling edges, or a combination of rising and falling edges of the high frequency reference can be used to define output signal edges of transitions.

Figure 11:
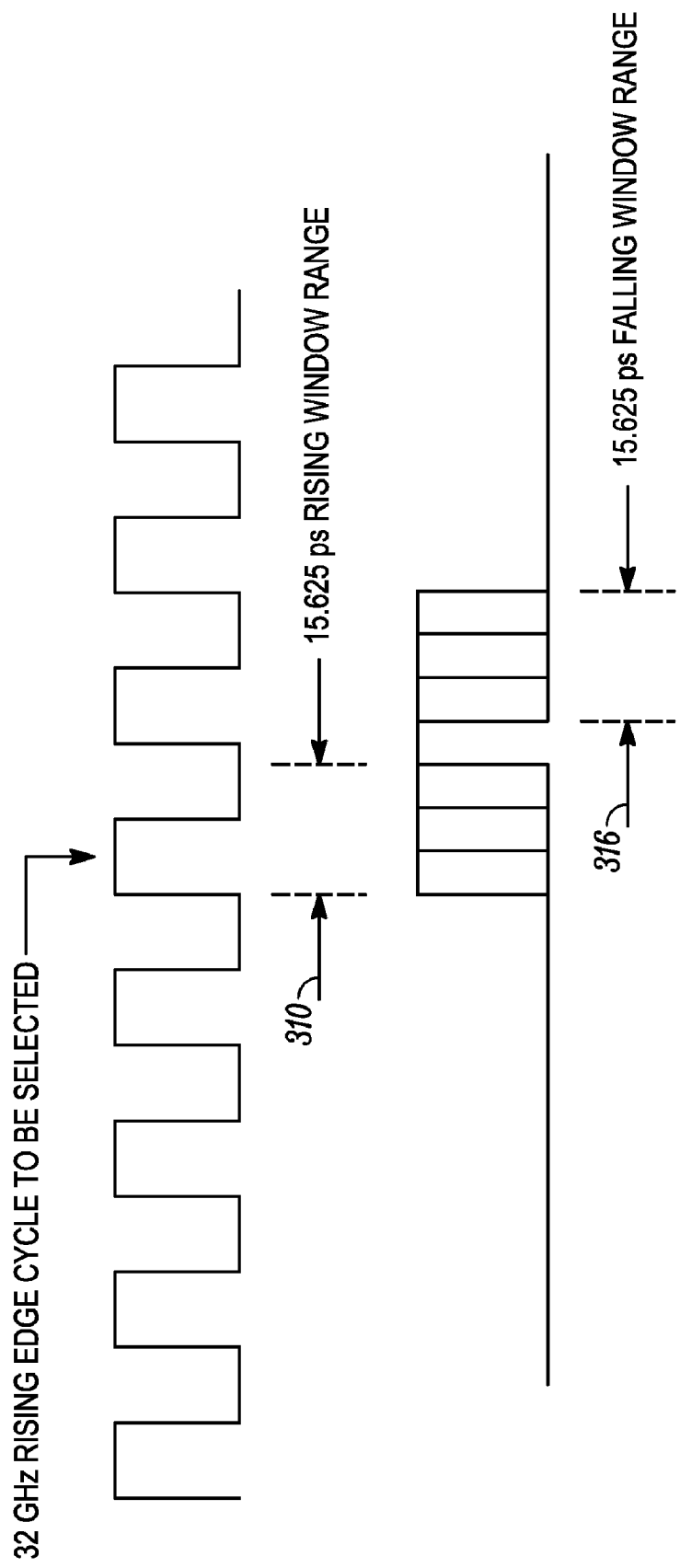
FIG. 11 is a timing diagram illustrating windowing of rising and falling edges in a manner consistent with embodiments of the present invention.

FIG. 11 illustrates that for a 32 GHz rising edge cycle that is to be selected, a 15.625 Pico-second rising window range 310 is available, and similarly at 316, a 15.625 Pico-second falling window range is available. The windowing time resolution requirements are significantly larger than those of the digital-to-time converter associated with the output signal. One measure of a digital-to-time converter signal quality is the edge resolution relative to the output signal. For example a programmable fine delay with step size of approximately 1 Pico-second would have an edge resolution of ±0.5 Pico-second resolution relative to 1 Nano-second period of a 1 GHz output signal. This is approximately 1000 to one or 10 bits of digital-to-time resolution defining a 1 GHz signal. What results is a quantization error of 1 out of 1000 or approximately −60 dBc. The time resolution requirement of the delay lock loop system used in the windowing function is 15.625 Pico-seconds compared to 1 Pico-second for the digital-to-time converter associated with the output signal generation system.

In any of the examples illustrated, the particular rising or falling edges or both are determined by the control logic or control processor 42 to provide a clock function or other output with the edges located with precision to define a particular clock output signal or other signal.

While the present invention has been described in terms of illustrative embodiments, those skilled in the art will appreciate that these embodiments are merely illustrative. While the particular windowing function circuit described is preferred, other windowing logic and windowing functions can be utilized to generate an appropriate window for selection of the particular rising or falling edge of the high frequency reference clock. For example, a non-integer divider could be utilized to implement programmable windowing function 38. Moreover, in certain applications, it may be desirable to provide only a single output frequency that does not have to vary on command from control logic or control processor 42. In such cases, hardwired embodiments can be readily derived from the teachings herein. The control logic or control processor 42 may be either hardware or software based and other types of delay besides R-C delay, such as that described, can be utilized to achieve the fine resolution delay desired.

Those skilled in the art upon consideration of the present teachings will also recognize that by appropriate application of control to generation of the output signal $F_{OUT}$, the present circuit can be utilized not only for generation of a wide range of clock signals, but also for purposes of generating modulated signals. That is, the effective amplitude, phase, and frequency can be varied by windowing appropriate high frequency reference clock pulses to achieve direct modulation thereof. Hence, while the presently preferred application is for generation of a variable clock reference for use, for example, in communication circuits, the present invention in other embodiments can be utilized to directly provide any desired type of modulation by simply selecting an appropriate collection of clock pulses to devise a pattern of output pulses corresponding to a modulated output. In addition, such modulated output is produced simply by change of control exerted by control logic or control processor 42.

Using this technique for direct frequency generation, it is possible to instantly change frequencies without any startup delay or transitional delay between changes in frequency.

By removing the digital-to-time converter from the synthesized output signal path its impact on the output signal quality is eliminated. The windowing function is much more tolerant of the digital-to-time converter imperfections including thermal noise. The result is a system with time resolution performance limited by the fine delay line matching and absolute delay resolution. In the example given, this is expected to be about 1 Pico-second with an accuracy resolution of 0.1 Pico-second, wherein the system is limited only by the combined noise performance of a 32 GHz voltage controlled oscillator phase lock loop design in series with a programmable fine delay function.

While certain embodiments herein were described in conjunction with specific circuitry that carries out the functions described, other embodiments are contemplated in which the circuit functions are carried out using equivalent software or firmware embodiments executed on one or more programmed processors. General purpose computers, microprocessor based computers, micro-controllers, optical computers, analog computers, dedicated processors, application specific circuits and/or dedicated hard wired logic and analog circuitry may be used to construct alternative equivalent embodiments. Other embodiments could be implemented using hardware component equivalents such as special purpose hardware and/or dedicated processors.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A signal generator, comprising:
    a reference clock producing a periodic sequence of reference clock output pulses;
    a window generator, that generates a plurality of time windows through which a selected plurality of the reference clock output pulses are selectively passed as windowed pulses so that the windowed pulses form a selected pattern of pulses;
    a programmable delay, having resolution of delay that has finer time granularity in delay than the period of the clock output pulses; and
    the programmable delay delaying each of the windowed pulses by a programmed delay time to thereby provide a timing correction to the windowed pulses to produce an output pattern of pulses;
    a controller means for controlling the location of the time windows and the delay times; and wherein the window generator comprises;

a delay line with a plurality of output taps;
window selection logic responsive to the controller means, for logically selecting at least one of the output taps to represent the selected pattern of pulses; and
a logic gate receiving selected pattern of pulses and gating the reference output clock pulses using the selected pattern of pulses.

2. The signal generator according to claim 1, wherein the time windows and the delay times are selected by the controller means to produce an output pattern of pulses having a 50% duty cycle.

3. The signal generator according to claim 1, wherein the time windows and the delay times are selected by the controller means to produce an output pattern of pulses having a duty cycle that is not 50%.

4. The signal generator according to claim 1, wherein the time windows and the delay times are selected by the controller means to produce a modulated output pattern of pulses.

5. The signal generator according to claim 1, wherein the delay line is clocked at a clock rate that is much lower than the reference clock rate.

6. The signal generator according to claim 1, wherein the window generator is clocked at a clock rate that is much lower than the reference clock rate.

7. The signal generator according to claim 1, wherein the window generator is clocked by a clock signal that is generated by dividing the reference clock.

8. The signal generator according to claim 1, wherein the programmable delay is programmed by varying at least one of a total resistance and a total capacitance in a resistor and capacitor based delay circuit.

9. The signal generator according to claim 1, wherein the programmable delay has resolution of delay that has much finer time granularity in delay than the period of the clock output pulses.

10. The signal generator according to claim 1, wherein the programmable delay is programmable in increments that are approximately $1/32$ of the period of the clock output pulses.

11. The signal generator according to claim 1, wherein the reference clock comprises one of a differential clock and a quadrature clock.

12. A signal generator, comprising in combination:
reference clock producing a periodic sequence of reference clock output pulses;
a window generator, that generates a plurality of time windows through which a selected plurality of the reference clock output pulses are selectively passed as windowed pulses so that the windowed pulses form a selected pattern of pulses, the window generator comprising:
a low frequency clock operating at a frequency lower than the reference clock;
a delay line with a plurality of output taps;
window selection logic for logically selecting at least one of the output taps to represent the selected pattern of pulses; and
a logic gate receiving selected pattern of pulses and gating the reference output clock pulses using the selected pattern of pulses;
a programmable delay delaying each of the windowed pulses by a programmed delay time to thereby provide a timing correction to the windowed pulses to produce an output pattern of pulses;
a controller that controls the location of the time windows generated by the window selection logic and the delay times generated by the programmable delay.

13. The signal generator according to claim 12, wherein the time windows and the delay times are selected by the controller to produce an output pattern of pulses having a 50% duty cycle.

14. The signal generator according to claim 12, wherein the time windows and the delay times are selected by the controller means to produce an output pattern of pulses having a duty cycle that is not 50%.

15. The signal generator according to claim 12, wherein the time windows and the delay times are selected by the controller means to produce a modulated output pattern of pulses.

16. The signal generator according to claim 12, wherein the low frequency clock is generated by dividing the reference clock.

17. The signal generator according to claim 12, wherein the programmable delay is programmed by varying at least one of a total resistance and a total capacitance in a resistor and capacitor based delay circuit.

18. The signal generator according to claim 12, wherein the programmable delay has resolution of delay that has much finer time granularity in delay than the period of the clock output pulses.

19. The signal generator according to claim 12, wherein the programmable delay is programmable in increments that are approximately $1/32$ of the period of the clock output pulses.

20. The signal generator according to claim 12, wherein the reference clock comprises one of a differential clock and a quadrature clock.

21. A signal generator, comprising in combination:
a 32 GHz reference clock producing a periodic sequence of reference clock output pulses;
a divide-by-32 divider that divides the reference clock to produce a 1 GHz low frequency clock;
a window generator, that generates a plurality of time windows through which a selected plurality of the reference clock output pulses are selectively passed as windowed pulses so that the windowed pulses form a selected pattern of pulses, the window generator comprising:
a delay line receiving the 1 GHz clock and having a plurality of output taps;
window selection logic for logically selecting at least one of the output taps to represent the selected pattern of pulses; and
a logic gate receiving selected pattern of pulses and gating the reference output clock pulses using the selected pattern of pulses;
a programmable delay, having resolution of delay that is approximately $1/32$ of a period of the reference clock output pulses;
the programmable delay delaying each of the windowed pulses by a programmed delay time to thereby provide a timing correction to the windowed pulses to produce an output pattern of pulses;
a controller that controls the location of the time windows generated by the window selection logic and the delay times generated by the programmable delay.

22. The signal generator according to claim 21, wherein the time windows and the delay times are selected by the controller means to produce an output pattern of pulses having a 50% duty cycle.

23. The signal generator according to claim 21, wherein the time windows and the delay times are selected by the controller means to produce an output pattern of pulses having a duty cycle that is not 50%.

24. The signal generator according to claim 21, wherein the time windows and the delay times are selected by the controller means to produce a modulated output pattern of pulses.

25. The signal generator according to claim 21, wherein the programmable delay is programmed by varying at least one of a total resistance and a total capacitance in a resistor and capacitor based delay circuit.

26. The signal generator according to claim 21, wherein the reference clock comprises one of a differential clock and a quadrature clock.

27. A signal generator, comprising in combination:

a reference clock producing a periodic sequence of reference clock output pulses having a rising edge and a falling edge;

a rising edge window generator, that generates a plurality of time windows through which a selected plurality of the rising edges are selectively passed as windowed rising edges so that the windowed rising edges form a selected pattern of rising edges;

a falling edge window generator, that generates a plurality of time windows through which a selected plurality of the falling edges are selectively passed as windowed falling edges so that the windowed falling edges form a selected pattern of falling edges;

a rising edge programmable delay, having resolution of delay that has finer time granularity in delay than the period of the clock output pulses, the rising edge programmable delay delaying each of the windowed rising edges by a programmed delay time to thereby provide a timing correction to the windowed rising edges to produce a pattern of rising edges;

a falling edge programmable delay, having resolution of delay that has finer time granularity in delay than the period of the clock output pulses, the falling edge programmable delay delaying each of the windowed falling edges by a programmed delay time to thereby provide a timing correction to the windowed falling edges to produce a pattern of falling edges;

means for combining the rising and falling edges to produce an output signal;

a controller means for controlling the location of the time windows and the delay lines; and wherein each of the window generators comprises:

a delay line with a plurality of output taps;

window selection logic responsive to the controller means, for logically selecting at least one of the output taps to represent the selected pattern of rising or falling edges; and a logic gate receiving selected pattern of rising or falling edges and gating the reference output clock pulses using the selected pattern of rising or falling edges.

28. The signal generator according to claim 27, wherein the time windows and the delay times are selected by the controller means to produce an output pattern of pulses having a 50% duty cycle.

29. The signal generator according to claim 27, wherein the time windows and the delay times are selected by the controller means to produce an output pattern of pulses having a duty cycle that is not 50%.

30. The signal generator according to claim 27 wherein the time windows and the delay times are selected by the controller means to produce a modulated output pattern of pulses.

31. The signal generator according to claim 27, wherein the delay line is clocked at a clock rate that is much lower than the reference clock rate.

32. The signal generator according to claim 27, wherein the window generator is clocked at a clock rate that is much lower than the reference clock rate.

33. The signal generator according to claim 27, wherein the window generator is clocked by a clock signal that is generated by dividing the reference clock.

34. The signal generator according to claim 27, wherein the programmable delay is programmed by varying at least one of a total resistance and a total capacitance in a resistor and capacitor based delay circuit.

35. The signal generator according to claim 27, wherein the programmable delay has resolution of delay that has much finer time granularity in delay than the period of the clock output pulses.

36. The signal generator according to claim 27, wherein the programmable delay is programmable in increments that are approximately $1/32$ of the period of the clock output pulses.

37. The signal generator according to claim 27, wherein the reference clock comprises one of a differential clock and a quadrature clock.

* * * * *